United States Patent
Kim et al.

(10) Patent No.: US 6,483,744 B2
(45) Date of Patent: Nov. 19, 2002

(54) MULTI-STATE NON-VOLATILE SEMICONDUCTOR MEMORY DEVICE

(75) Inventors: Eun-Cheol Kim, Kyunggi-do (KR); Yeong-Taek Lee, Seoul (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/887,904

(22) Filed: Jun. 21, 2001

(65) Prior Publication Data

US 2002/0001227 A1 Jan. 3, 2002

(30) Foreign Application Priority Data

Jun. 28, 2000 (KR) ........................................ 2000-36097

(51) Int. Cl.[7] .............................................. G11C 16/04
(52) U.S. Cl. ............................ 365/185.03; 365/185.17; 365/185.25
(58) Field of Search ..................... 365/185.03, 185.17, 365/185.18, 185.25

(56) References Cited

U.S. PATENT DOCUMENTS

| | | | | |
|---|---|---|---|---|
| 5,740,112 A | * | 4/1998 | Tanaka et al. | 365/189.01 |
| 5,966,326 A | * | 10/1999 | Park et al. | 365/185.11 |
| 6,122,193 A | * | 9/2000 | Shibata et al. | 365/185.03 |
| 6,128,229 A | * | 10/2000 | Nobukata | 365/185.22 |
| 6,266,270 B1 | * | 7/2001 | Nobukata | 365/185.03 |

* cited by examiner

Primary Examiner—Huan Hoang
Assistant Examiner—Gene N. Auduong
(74) Attorney, Agent, or Firm—Marger Johnson & McCollom, P.C.

(57) ABSTRACT

A non-volatile semiconductor memory device including a memory cell array having a plurality of memory cells coupled to a plurality of bitlines and wordlines, each memory cell being programmed to one of plurality of data storage states. A node is connected to a selected bitline responsive to a storage state in a selected memory cell. A plurality of latched registers is connected to the node to store and output data bits corresponding the storage state, the data bits being assigned to the selected bitline. A circuit is adapted to precharge the selected bitline before sensing the selected memory cell and is adapted to equalize the selected bitline and the node after sensing the selected memory cell.

19 Claims, 3 Drawing Sheets

MULTI-STATE NON-VOLATILE SEMICONDUCTOR MEMORY DEVICE

This application claims priority from Korean Patent Application No. 2000-36097, filed on Jun. 28, 2000, the contents of which are herein incorporated by reference in their entirety.

FIELD OF THE INVENTION

The present invention relates to integrated circuit memory devices and, more particularly, to non-volatile integrated circuit memory devices storing and being accessible with multi-state data.

BACKGROUND OF THE INVENTION

Flash memories have recently been developed for personal computers. In this context, flash memories are advantageous because they are capable of storing and quickly erasing large amounts of information.

Before reading information stored in the cells of a memory device, it is necessary to check the information storing state of a selected cell. Signals required to check the storing state of the selected memory cell are applied to circuits associated with the selected memory cell by use of a decoder circuit. A current or voltage signal indicative of the storing state of the selected memory cell is placed on a bit line. By doing so, the storing state indicative of the programmed information of a memory cell can be found by measuring the obtained current or voltage signal.

When reading information stored in a NAND-type memory device, a selected transistor in a selected string is switched to the ON state. In addition, a voltage higher than that applied to the control gate of the selected memory cell is applied to the control gates of unselected memory cells. As a result, the unselected memory cells have a low equivalent resistance as compared to the selected memory cell. The magnitude of the current flowing through the string from the associated bit line thus depends on the information stored in the selected memory cell of the string. The voltage or current corresponding to the information stored in each selected memory cell is sensed by a sensing circuit e.g., a sense amplifier.

Many schemes have been proposed to increase the information storage capacity of memory devices without a consequent increase in chip size. Conventionally, a memory cell stores a single bit of information. It is technically possible, however, to store at least two bits of information in a single memory cell. When 2 bits of information are stored in a single memory cell, the memory cell is programmed with either "00", "01", "10" or "11". Accordingly, a memory device can store twice the information with the same number of memory cells as compared to a memory device wherein only a single bit is stored in a single memory cell. When storing 2 bits per memory cell, a multi-state memory device is provided wherein the threshold voltage of each memory cell can be programmed to have one of four different values. Because the memory capacity per memory cell is doubled, the chip size can be reduced while providing the same memory capacity. As the number of bits stored per memory cell increases, the data storage capacity of the multi-state memory device increases.

The topology of integrated flash memory devices is becoming denser. As this happens, the amount of current passing through a bit line when a selected memory cell is an on-cell is reduced resulting in a longer developing time for the bit line. Accordingly, a need remains for a multi-bit flash memory device that addresses this and other disadvantages associated with the prior art.

BRIEF DESCRIPTION OF THE DRAWINGS

The present invention will be described by way of exemplary embodiments, but not limitations, illustrated in the accompanying drawings in which like references denote similar elements.

Figure 1:
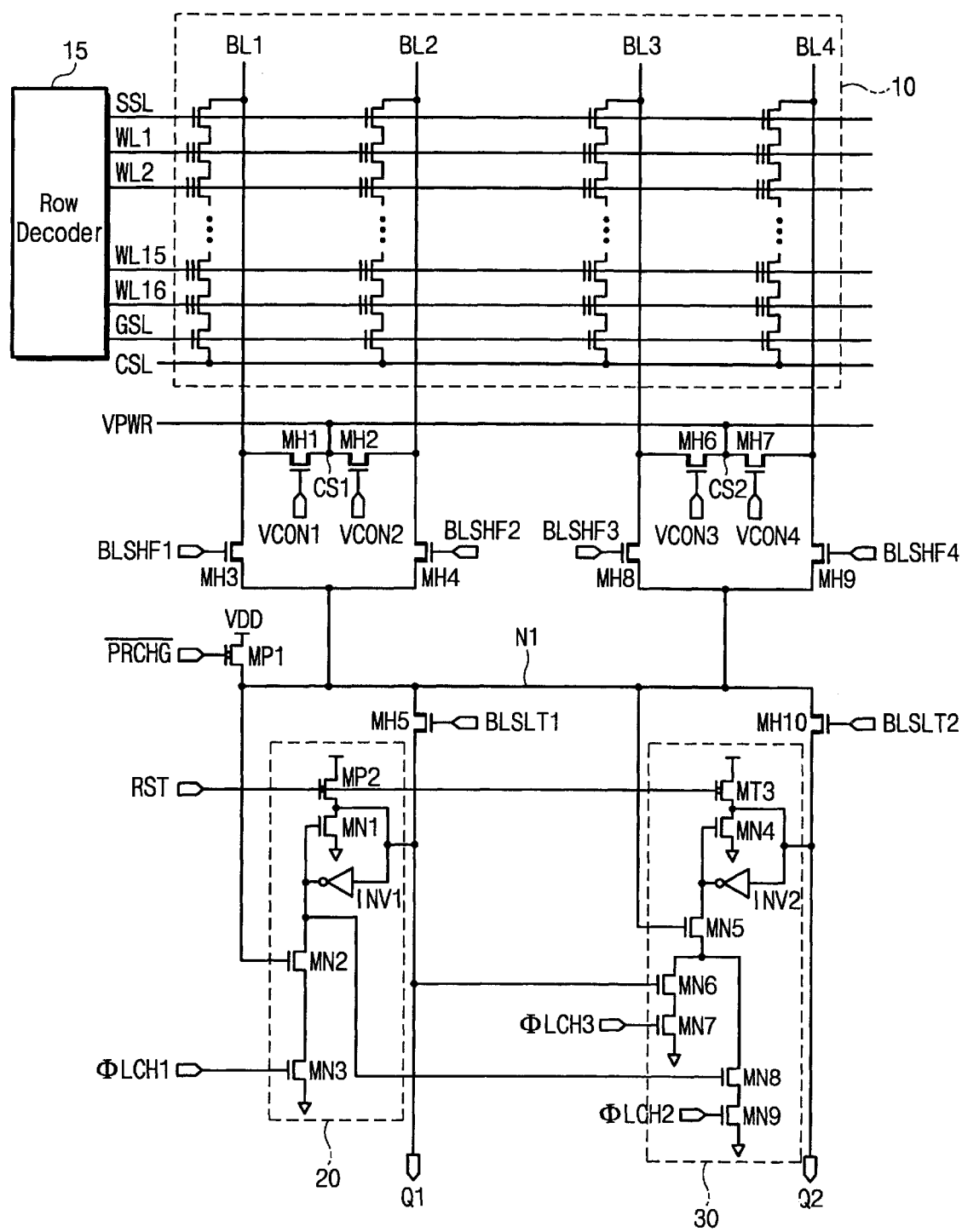
FIG. 1 is a block diagram of a preferred embodiment of the present invention.

In the drawings, as in the following description, use of the suffix "B" for a signal name indicates that the signal is active in at logic low level (negative logic).

DESCRIPTION OF THE PREFERRED EMBODIMENT

It should be understood that the description of this preferred embodiment is merely illustrative and that it should not be taken in a limiting sense. In the following detailed description, several specific details are set forth in order to provide a thorough understanding of the present invention. It will be obvious, however, to a person skilled in the art that the present invention may be practiced without these specific details.

FIG. 1 shows a configuration of circuits for performing a read-out operation from memory cells storing multi-bit data bits. Referring now to FIG. 1, memory cell array 10 is constructed of a plurality of cell strings which are connected to their corresponding bitlines BL1~BL4. Each of the cell strings is formed of string selection transistor ST1, memory cells M1~M16, and ground selection transistor GT1. The string selection transistor ST1 is connected to the bitline BL1, and the ground selection transistor GT1 is connected to common source line CSL. The memory cells M1~M16 are serially connected between the string and ground selection transistors. The number of the memory cells disposed in one cell string varies according to desired storage capacity and arrangement within the flash memory. A gate of a string selection transistor (like ST1 in every cell string) is coupled to a string selection line SSL that transfers a string selection signal supplied from row decoder 15. A gate of the ground selection transistor is coupled to ground selection line GSL that transfers a ground selection signal supplied from the row decoder 15. Control gates of the memory cells M1~MI6 are coupled to corresponding wordlines WL1~WL16.

NMOS enhancement transistors MH1 and MH2 are serially connected between bitlines BL1 and BL2. NMOS enhancement transistors MH6 and MH7 are serially connected is, between bitlines BL3 and BL4. Common source nodes CS1 and CS2 of transistors MH1 and MH2, and MH6 and MH7, respectively, are connected to voltage line VPWR. Voltage line VPWR is grounded. Gates of transistors MH1 and MH2 are coupled to signals VCON1 and VCON2, respectively. Gates of transistor MH6 and MH7 are coupled to control signals VCON3 and VCON4, respectively. NMOS enhancement transistor MH3 connects BL1 to node N1 responsive to signal BLSHF1. NMOS enhancement transistor MH4 connects BL2 to N1 responsive to signal BLSHF2. NMOS enhancement transistor MH8 connects BL3 to node N1 responsive to signal BLSHF3. NMOS enhancement transistor MH9 connects BL4 to N1 responsive to signal BLSHF4. NMOS enhancement transistors MH5 and MHnO connect node N1 to latched register circuit 20 and 30 responsive to bitline selection signals BLSLT1 and BLSLT2, respectively. The NMOS enhancement transistors MH1~MH10 are adaptable to drive high voltages that are used in erasing memory cells. PMOS transistor MP1 connected between power supply voltage VDD and the node N1. PMOS transistor MP1 is responsive to precharge signal PRCHGB.

Register circuit 20 is connected to node N1 through transistor MH5. PMOS transistor MP2 is connected between VDD and output terminal Q1. The transistor MP2 resets the register circuit 20 responsive to signal RST. NMOS transistor MN1 is connected between output terminal Q1 and ground voltage. Inverter INV1 is connected in forward direction between the output terminal Q1 and a gate of transistor MN1. NMOS transistors MN2 and MN3 are serially connected. Node N2 is positioned at the gate of transistor MN1. The gate of transistor MN2 is coupled to node N1 and the gate of transistor MN3 is coupled to latch enable signal ΦLCH1.

The register circuit 30 is connected to node N1 through transistor MH10. PMOS transistor MP3 is connected between VDD and output terminal Q2. The transistor MP3 resets the register circuit 30 responsive to the signal RST. NMOS transistor MN4 is connected between output terminal Q2 and the ground voltage. Inverter INV2 is connected in a forward direction between output terminal Q2 and a gate of transistor MN4 (node N3). The gate of NMOS transistor MN5 is connected to node M. NMOS transistor MN5 is connected between nodes N3 and N4. From N3 to the ground, there are two parallel paths. The first path is formed of NMOS transistors MN6 and MN7 and the second path is formed of NMOS transistors MN8 and MN9. The gate of transistor MN6 is coupled to output terminal Q1 and the gate of transistor MN7 is coupled to latch enable signal ΦLCH3. The gate of transistor MN8 is coupled to node N2 and the gate of transistor MN9 is coupled to latch enable signal ΦLCH2.

Figure 2:
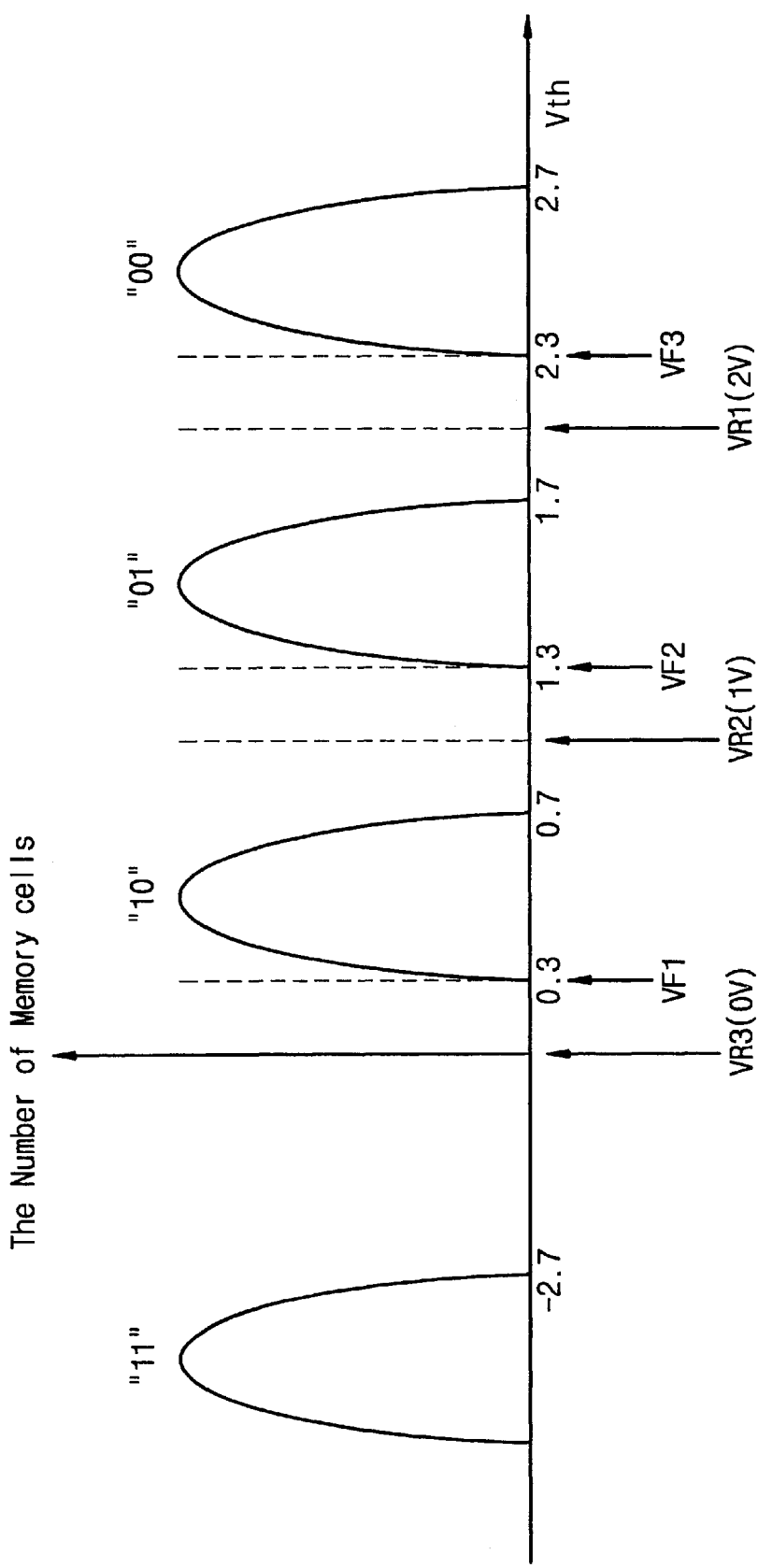
FIG. 2 is a graph of the distribution profiles of threshold voltages.

A multi-bit storage state of a memory cell operates as follows. Referring to FIG. 2, a memory cell of the present invention stores one of four storage states, "00", "01", "10", and "11". Each of the four storage states corresponds to a threshold voltage of the memory cell.

For example, as shown in FIG. 2, storage states "00", "01", "10", and "11" are assigned threshold voltages within a distribution range as follows: 2.3~2.7V (first voltage VF3 is 2.3V), 1.3~1.7V (VF2 is 1.3V),0.3~0.7V (VF1 is 0.3V), and under –2.7V, respectively. Detecting a memory cell storage state is determined by applying reference voltages positioned intermediately along the distribution range of the threshold voltages. For instance, if a reference voltage VR1 is applied to a wordline corresponding to a selected memory cell that has been set into the threshold voltage assigned to "00", the memory cell will be defined as an off-cell because the voltage VR1 of 2V cannot turn it on. On the other hand, if the selected memory cell is programmed to "01", "10", or "11", the memory cell will be defined as an on-cell because the reference voltage VR1 is higher than the range of associated threshold voltages.

Figure 3:
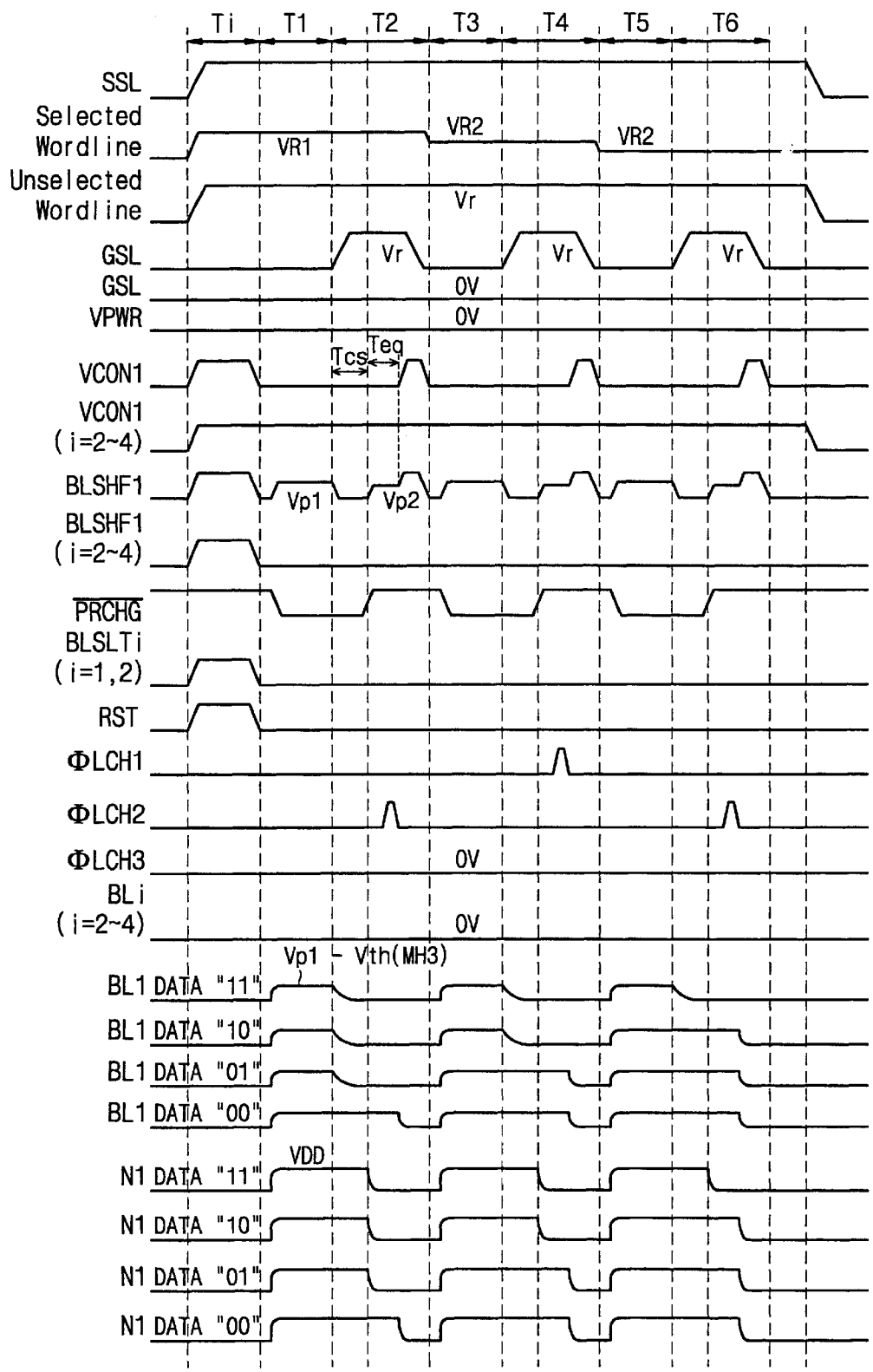
FIG. 3 is a timing diagram of the circuit shown in FIG. 1.

Referring to FIG. 3, a read-out operation for the multi-bit storage memory cell is as follows. The operating sequence shown in FIG. 3 comprises three steps. Step 1 includes applying e.g., the first reference voltage VR1 (2V) to detect that a selected memory cell is programmed to storage state "00". Step 2 includes applying e.g., the second reference voltage VR2 (1V) to detect that the selected memory cell is programmed to storage state "01", if the selected memory cell was detected as an on-cell in the step 1. Step 3 includes applying e.g., the third reference voltage VR3 (0V) to detect whether the selected memory cell is programmed to storage states "10" or "11", if the selected memory cell was detected as an on-cell in the step 2. At step 3, if the selected memory cell is detected as an off-cell, it is assigned to storage state "10". If the selected memory cell is detected as an on-cell, it is assigned to storage state "11". In the example explained above, the selected memory cell is M1 assigned to wordline WL1 and bitline BL1 and the source voltage VDD is 3.3V. Also it is assumed that the selected memory cell M1 is programmed to storage state "00".

During the reset period Ti, the circuitry except the memory cell array is reset by logic high signals VCON1~VCON4, BLSHF1~BLSHF4, PRCHGB, BLST1~BLST2, and RST setting node N1 and output terminals Q1 and Q2 to logic low levels. The string selection line SSL and unselected word lines WL2~WL16 are held to a read voltage Vr of about 6V throughout the entire Ti reset period. The ground selection line GSL is enable to the read voltage Vr (6V) for substantial sensing periods T2, T4, and T6. After the reset period Ti, the precharge signal PRCHGB is enable at a logic low level to provide the supply voltage VDD to node N1 until an equalization between bitline BL1 and node N1 begins signals BLSHF2~BLSHF4 not involved in the selected bitline BL1 are disable with logic low levels.

During period T1, signal BLSHF1 goes to a first precharge level Vp1 of about 1.7V after falling to 0V, so that bitline BL1 is charged up to level Vp1-Vth. Vth is the threshold voltage of transistor MH3. Signal VCON1 falls to a logic low level to disconnect bitline BL1 from signal VPWR.

During period T2, bitline BL1 retains the precharge level Vp1-Vth and node N1 is at the voltage supply VDD level because no current flows through cell M1 which has a higher threshold voltage than the read voltage VR1. Sub-period Tcs of period T2 allows for bitline sensing when BLSHF1 is at a logic low level. It should be noted that, since BL1 starts to be developed from the precharge level Vp1-Vth during Tcs, the time required to detect whether cell M1 is an on-cell or an off-cell is shortened. On the other hand, if the selected memory cell M1 is an on-cell that is turned on against reference voltage VRI, bitline BL1 falls down to low level from the Vp1-Vth, as shown by the wave forms of DATA "01", DATA "10", or DATA "11".

The precharge signal PRCHGB is disabled to a logic high level at the end of period Tcs. During sub-period Teq of T2, signal BLSHF1 rises from 0V to the second precharge level Vp2 of about 1.3V in order to equalize node N1 and bitline BL1 at the supply voltage VDD level. The static capacitance of bitline BL1 is large compared to that of node N1 such that the voltage levels of bitline BL1 and node N1 can be equalized when signal BLSHF1 is on the Vp1. In addition, a voltage difference between voltages Vp1 and Vp2, of about 0.3~0.4V, is established when the path between bitline BL1 and node N1 is opened, considering the small drain-to-source voltage of transistor MH3. Since there is no current through the cell string including cell M1 of an off-cell, node N1 retains supply voltage VDD (or high level) and output terminal Q2 changes to data bit "1" (or high level) responsive to a logic high signal ΦLCH2. A signal BLSHF1 goes to a logic high level from the second precharge level Vp2 and signal VCON1 is enable to a logic high level, bitline BL1 and node N1 falls to ground (or 0V).

While the aforementioned description is relevant to reading a memory cell with DATA "00", if the selected memory cell M1 is programmed with DATA "01", the read-out operation (corresponding to the cycle including T1 and T2) would proceed until the end of period T4 where cell M1 is detected as an off-cell. A selected memory cell M1 involved in DATA "10"or "11"would be put into read-out cycles extending to the end of period T6.

As described above, the invention provides a faster read-out operation by means of precharging a selected bitline and a voltage node for sensing a storage state of a selected memory cell, overcoming the disadvantage, i.e., a longer bitline developing time due to a higher circuit density.

What is claimed is:

1. A non-volatile semiconductor memory device, comprising:
    a memory cell array having a plurality of memory cells coupled to a plurality of bitlines and wordlines, each memory cell being programmed to one of four data storage states;
    a node selectively connected to a bitline responsive to a storage state in a selected memory cell;
    a first transistor including a gate adapted to receive a reset signal and a channel coupled at a first end to a power supply;
    a second transistor including a gate and a channel, the channel of the second transistor having a first end connected to a second end of the first transistor and a second end connected to ground;
    an inverter connected between the first end and the gate of the second transistor;
    a third and fourth transistors having channels serially connected between the gate of the second transistor and ground, the fourth transistor having a gate adapted to receive a latch signal;
    a fifth transistor having a channel connected between the power supply and a gate of the third transistor and a gate adapted to receive a precharge signal; and
    a sixth transistor having a gate adapted to receive a bit line selection signal and a channel connected between the node and the first end of the second transistor.

2. The non-volatile semiconductor memory device of claim 1 wherein the bitline is connected to a shielding voltage terminal through a transistor responsive to a shielding signal.

3. The non-volatile semiconductor memory device of claim 1 wherein the node is connected to the bitline through a transistor responsive to a first signal and connected to a power voltage terminal through the second transistor.

4. A nonvolatile semiconductor memory device, comprising:
    at least one string connected to a bit line and having a plurality of serially connected memory cells each storing multi-bit data;
    a first transistor connected between the bit line and a sense node, the first transistor being adapted to connect the bit line to the sense node responsive to a first control signal;
    a second transistor connected between a power supply voltage and the sense node, the second transistor being adapted to supply an amount of current to the sense node responsive to a second control signal; and
    at least two latched registers connected in common to the sense node, the at least two latched registers being adapted to store multi-bit data from the sense node in a read operation and being adapted to provide externally-received multi-bit data to the sense node in a program operation;
    wherein the first transistor is turned off by the first control signal between a bit line precharge period and a bit line sense period of the read operation.

5. The memory device of claim 4 wherein the first control signal has a voltage sufficient to turn off the first transistor in a bit line develop period of the read operation.

6. The memory device of claim 5 wherein the bit line is electrically isolated from the sense node during the bit line develop period such that a voltage on the bit line is determined according to a state of a selected memory cell.

7. The memory device of claim 5
    wherein the second control signal has a voltage sufficient to turn on the second transistor in the bit line precharge period and the bit line develop period; and
    wherein the second control signal has a voltage sufficient to turn off the second transistor in the bit line sense period.

8. The memory device of claim 4 wherein the first control signal has a first voltage in the bit line precharge period and has a second voltage different from the first voltage in the bit line sense period.

9. The memory device of claim 8 wherein the first voltage is higher than the second voltage.

10. The memory device of claim 9 wherein a voltage difference between the first voltage and the second voltage is between 0.3 to 0.4 volts.

11. The memory device of claim 4 wherein the first control signal has a voltage sufficient to turn of the first transistor in a reset period of the read operation.

12. A method for reading data from a nonvolatile semiconductor memory device, the memory device including a bit line connected to a string of serially connected memory cells each storing multi-bit data, a first transistor connected between the bit line and a sense node, a second transistor connected to a power supply voltage and the sense node, and latched registers connected in common to the sense node, the method comprising:
    supplying the bit line through the first transistor with an amount of precharge current flowing from the second transistor;
    isolating the bit line from the sense node; and
    connecting the bit line with the sense node such that the memory device senses a voltage on the sense node.

13. The method of claim 12 wherein supplying includes applying a first voltage to a control electrode of the first transistor higher than a second voltage.

14. The method of claim 13 wherein supplying includes applying a voltage difference between the first and second voltage of about 0.3 to 0.4 volts.

15. The method of claim 12 wherein isolating includes developing a voltage on the bit line responsive to a state of a selected memory cell.

16. A method of reading data from a nonvolatile semiconductor device, the semiconductor memory device including a bit line connected to a string of serially connected memory cells each storing multi-bit data, a first transistor connected between the bit line and a sense node, a second transistor connected to a power supply voltage and the sense node, and latched registers connected in common to the sense node, the method comprising:
    applying a first voltage to a control electrode of the first transistor such that the bit line is supplied, through the first transistor, with an amount of precharge current flowing from the second transistor;
    applying a second voltage to the control electrode of the first transistor such that the bit line is isolated from the sense node; and
    applying a third voltage different from the first voltage to the control electrode of the first transistor such that a voltage on the sense node is sensed.

17. The method of claim 16 wherein the first voltage is higher than the third voltage.

18. The method of claim 17 wherein a voltage difference between the first and the third voltage is about 0.3 to 0.4 volts.

19. The method of claim 16 wherein the first voltage and the second voltage are higher than the third voltage.

* * * * *